United States Patent
Park

(10) Patent No.: US 7,675,098 B2
(45) Date of Patent: Mar. 9, 2010

(54) REFLECTION TYPE CMOS IMAGE SENSOR AND METHOD OF MANUFACTURING THE SAME

(75) Inventor: Jeong Su Park, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 231 days.

(21) Appl. No.: 11/849,732

(22) Filed: Sep. 4, 2007

(65) Prior Publication Data

US 2008/0061329 A1    Mar. 13, 2008

(30) Foreign Application Priority Data

Sep. 8, 2006    (KR) .................... 10-2006-0086635

(51) Int. Cl.
*H01L 31/062* (2006.01)

(52) U.S. Cl. ............................. 257/292; 257/E27.133; 257/E27.134; 438/69

(58) Field of Classification Search ................. 257/292, 257/E27.133, E27.134; 438/69
See application file for complete search history.

(56) References Cited

U.S. PATENT DOCUMENTS

| | | | |
|---|---|---|---|
| 2005/0279998 A1* | 12/2005 | Cole et al. | 257/59 |
| 2006/0081890 A1* | 4/2006 | Kang | 257/233 |
| 2006/0231898 A1* | 10/2006 | Jeong et al. | 257/359 |
| 2007/0138590 A1* | 6/2007 | Wells et al. | 257/462 |

* cited by examiner

*Primary Examiner*—Trung Dang
(74) *Attorney, Agent, or Firm*—Sherr & Vaughn, PLLC

(57) ABSTRACT

A complementary metal oxide semiconductor (CMOS) image sensor including a semiconductor substrate having an inclined groove with an inclined surface and a light reception surface perpendicular to the semiconductor substrate, and a device forming area adjacent the light reception surface. A reflection film selectively formed on and/or over the inclined surface, a plurality of photodiodes substantially perpendicular to the surface of the substrate; and at least one MOS transistor formed on the surface of the device forming area.

19 Claims, 3 Drawing Sheets

REFLECTION TYPE CMOS IMAGE SENSOR AND METHOD OF MANUFACTURING THE SAME

The present application claims priority under 35 U.S.C. 119 to Korean Patent Application No. P2006-0086635 (filed on Sep. 8, 2006), which is hereby incorporated by reference in its entirety.

BACKGROUND

An image sensor is a semiconductor device used to convert optical images detected by the image sensor to electric signals. Image sensors may be classified as a charge coupled device (CCD) and a complementary metal oxide semiconductor (CMOS).

A CMOS image sensor is provided with a plurality of MOS transistors corresponding to pixels of a semiconductor device having a control circuit and a signal processing circuit as peripheral circuits. The control circuit and the signal processing unit may be integrated together to employ a switching method that detects output through the MOS transistors.

A CMOS image sensor may be provided with a plurality of unit pixels whereby each unit pixel includes one light sensing device such as a photodiode and a plurality of MOS transistors.

Figure 1:
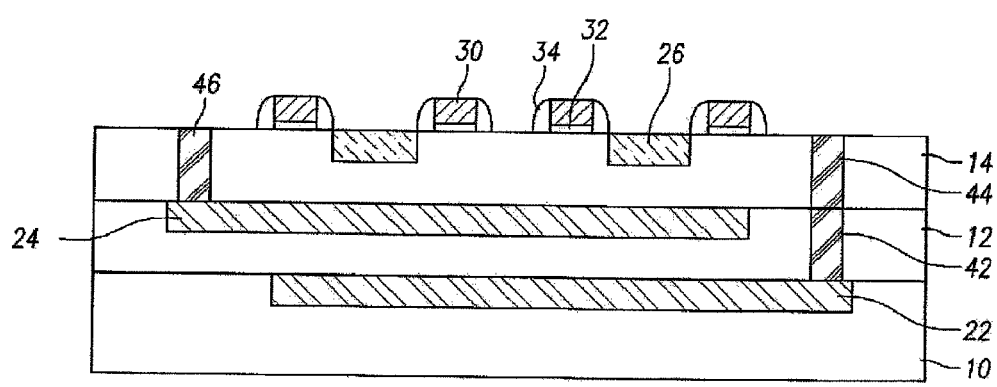

As illustrated in example FIG. 1, a CMOS image sensor includes a plurality of photodiodes 22, 24 and 26 formed on and/or over silicon substrate 10 by repeatedly performing ion implantation and a silicon epitaxial growth process. Photodiodes 22, 24 and 26 are configured to detect red light, green light and blue light. An ion implantation layer for red photodiode 22 can be formed in substrate 10 and first silicon epitaxial layer 12 can be formed thereon and/or thereover. Green photodiode 24 can be formed in first epitaxial layer 12 using an ion implantation process. Plug 42 for contacting red photodiode 22 can be formed in a portion of first epitaxial layer 12. Using a silicon epitaxial growth process, second silicon epitaxial layer 14 is formed and blue photodiode 26 is formed in second silicon epitaxial layer 14. Plug 46 for contacting green photodiode 24 and plug 44 for contacting red photodiode 22 can be formed. The plurality of MOS transistors for transferring optical charges detected by photodiodes 22, 24 and 26 can be formed on and/or over second silicon epitaxial layer 14. Each of the plurality of MOS transistors may include gate 30, gate insulating film 32, and spacer 34.

Because the respective sizes of red photodiode 22 and green photodiode 24 are larger than blue photodiode 26, and the transistors for delivering signals are arranged on an uppermost layer, only the size of blue photodiode 26 becomes a substantial light reception area. Consequently, the substantial light reception area can be smaller than that of the photodiodes. Plugs 42, 44 and 46 for processing the signal of red photodiode 22 or green photodiode 24 can be formed by the ion implantation process. However, if light is irradiated, noise may be generated in the signal due to the plugs. Photodiodes 22, 24 and 26 may be separately formed in order to prevent interference between them. An additional ion implantation layer for isolating photodiodes 22, 24 and 26 can be formed in each epitaxial layer 12 and 14.

SUMMARY

Embodiments relate to a reflective-type CMOS image sensor having a structure having enhanced light reflectivity.

Embodiments relate to a CMOS image sensor which may include a semiconductor substrate having a groove portion with an inclined surface and a light reception surface substantially perpendicular to the semiconductor substrate, and a transistor forming area defined at one side of the light reception surface of the inclined groove portion; a reflection film that can be selectively formed on the inclined surface of the inclined groove portion; a plurality of photodiodes substantially perpendicular to the surface of the substrate and spaced apart from each other in the transistor forming area; and at least one MOS transistor formed on and/or over the surface of the transistor forming area.

DRAWINGS

Example FIG. 1 illustrates a CMOS image sensor.
Example FIGS. 2A to 2D illustrate a method of manufacturing the CMOS image sensor, in accordance with embodiments.

DESCRIPTION

Figure 2A:
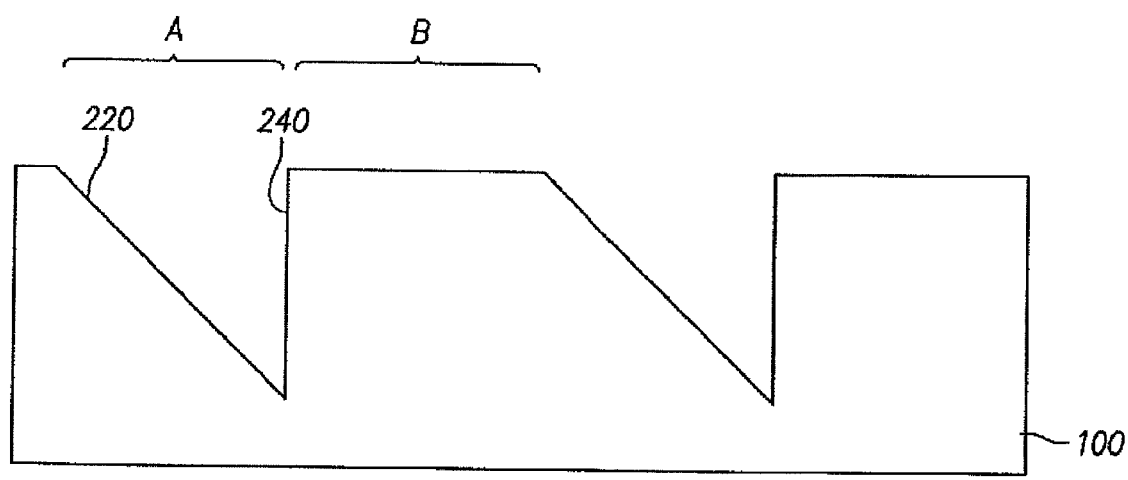
Figure 2B:
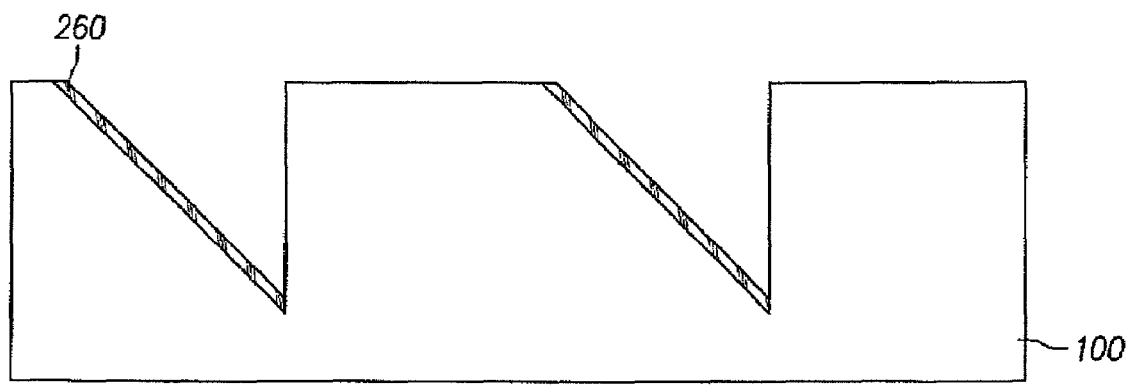

As illustrated in example FIGS. 2A and 2B, a CMOS image sensor includes silicon semiconductor substrate 100 having at least one groove A. Groove A may be formed of two separate surface areas: inclined surface 220 and light reception surface 240. Device forming area B defined at an upper surface of substrate 100 and adjacent to light reception surface 240 of inclined groove A. Inclined surface 220 may be configured such that it extends substantially at an incline relative to the surface of substrate 100. Reflection film 260 can be selectively formed on and/or over inclined surface 220. Reflection film 260 can be formed of a metal film which reflects visible light.

In accordance with embodiments, inclined surface 220 may have an angle of approximately 45 degrees with respect to the surface of the substrate such that the light reflected from reflection film 260 is directed towards light reception surface 240. Light reception surface 240 may be configured such that it extends substantially perpendicular to the surface of substrate 100.

A plurality of photodiodes 320, 340 and 360 may be provided on and/or over device forming area B. Photodiodes 320, 340 and 360 may be provided spaced apart from each other and substantially perpendicular to the uppermost surface of substrate 100. The plurality of photodiodes may include blue photodiode 320, green photodiode 340 and red photodiode 360. Blue photodiode 320, green photodiode 340 and red photodiode 360 can be sequentially formed adjacent light reception surface 240. Because blue light has a small penetration depth and red light has a large penetration depth, blue photodiode 320 may be formed at a position closest to light reception surface 240 and red photodiode 360 formed at a position farthest from light reception surface 240.

At least one MOS transistor including gate electrode 400, spacer 420 and gate insulating film 440 can be formed on and/or over the surface of substrate 100 in device forming area B.

As illustrated in example FIG. 2A, in accordance with embodiments, silicon semiconductor substrate 100 can be prepared and certain areas of substrate 100 may be etched to form groove A. Photodiodes 320, 340 and 360 and a plurality of MOS transistors may be formed at device forming area B. Inclined groove A may include two surfaces: inclined surface 220 and light reception surface 240. Inclined surface 220 may have an angle of approximately 45 degrees relative to the uppermost surface of substrate 100 and light reception surface 240 may be substantially perpendicular to the uppermost surface of substrate 100.

As illustrated in example FIG. 2B, reflection film 260 can be selectively formed on and/or over inclined surface 220 by depositing a metal film exhibiting excellent reflectivity against visible light on and/or over the entire surface of substrate 100 and polishing the surface of substrate 100 to remove the metal film. The surface of substrate 100 may be polished using a chemical-mechanical polishing method.

In accordance with embodiments, reflection film 220 may alternatively be formed by forming a photoresist film pattern on and/or over device forming area B using a photolithography process, depositing a metal film on and/or over the photoresist film pattern, and removing the photoresist film pattern.

Figure 2C:
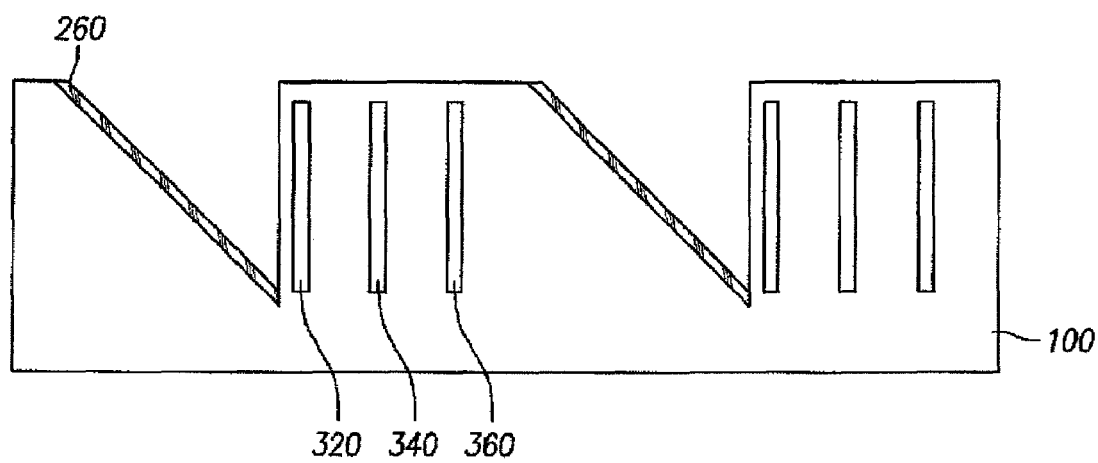

As illustrated in example FIG. 2C, an ion implantation process can be repeatedly performed on and/or over device forming area B to form photodiodes 320, 340 and 360. The ion implantation process may be performed using ion implantation energy that is adjusted such that ion implantation layers for photodiodes 320, 340, 360 are formed substantially perpendicular to the uppermost surface of substrate 100, i.e., substantially parallel to light reception surface 240. Blue photodiode 320, green photodiode 340 and red photodiode 360 can be sequentially formed spaced apart from each other in device forming area B adjacent light reception surface 240.

Figure 2D:
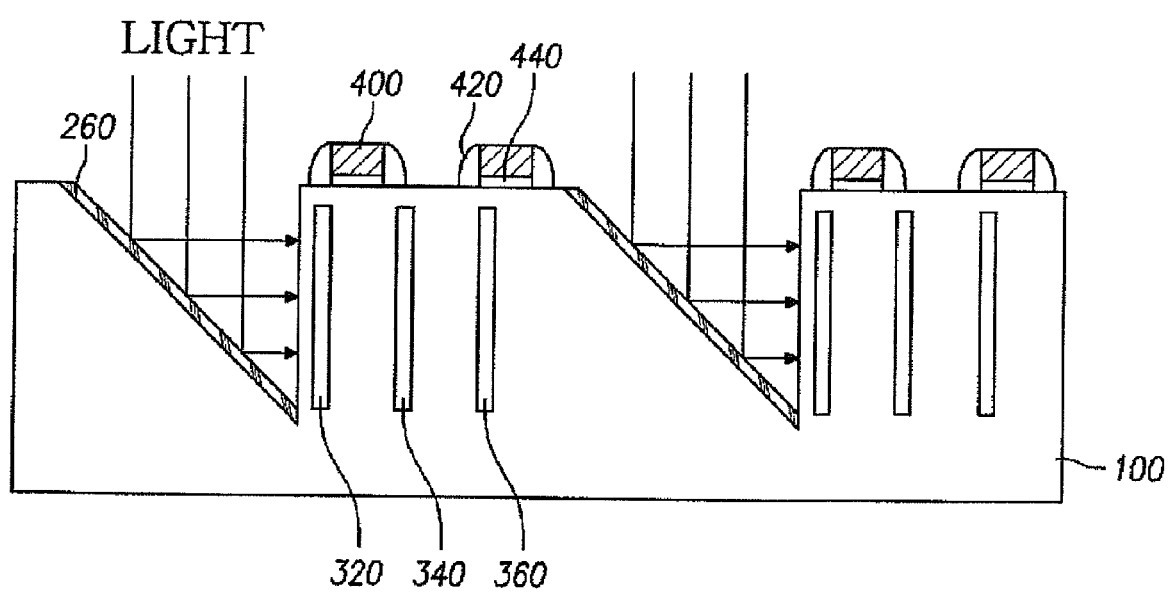

As illustrated in example FIG. 2D, at least one MOS transistor including gate electrode 400, spacer 420 and gate insulating film 440 can be formed on the uppermost surface of device forming area B of substrate 100. A predetermined plug can be electrically connected to photodiodes 320, 340 and 360 and the at least one MOS transistor may be formed to transmit signals generated by photodiodes 320, 340 and 360. Thereby, light which is vertically input to substrate 100 can be reflected from reflection film 260 by approximately 90 degrees, and the reflected light is received by light reception surface 240 and focused to photodiodes 320, 340, 360 where it is then converted into an electrical signal.

In accordance with embodiments, a CMOS image sensor is provided which reflects incident light by approximately 90 degrees and inputs the light to a plurality of photodiodes whereby an obstacle for blocking the light may be formed on the photodiodes. Accordingly, it is possible to facilitate the formation of a device having a laminate structure that can increase the overall area for receiving incident light. Since the photodiodes and the MOS transistors can be connected at a shortest distance, plugs may not be necessary. Accordingly, since the generation of noise in a signal due to multistage plugs can be prevented, it can be possible to enhance the capability of the device.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   forming a groove on a semiconductor substrate, the groove having a inclined surface substantially inclined relative to the uppermost surface of the substrate and a light reception surface perpendicular to the uppermost surface of the semiconductor substrate, wherein the substrate has a device forming area adjacent the light reception surface;
   forming a reflection film over the inclined surface;
   forming a plurality of photodiodes substantially perpendicular to the uppermost surface of the substrate in the device forming area; and
   forming at least one MOS transistor over the device forming area.

2. The method of claim 1, wherein the reflection film comprises a metal film that reflects visible light.

3. The method of claim 1, wherein the plurality of photodiodes comprise a blue photodiode, a green photodiode and a red photodiode.

4. The method of claim 3, wherein the blue photodiode, the green photodiode and the red photodiode are sequentially formed adjacent the light reception surface.

5. The method of claim 1, wherein the inclined surface is formed at an angle of approximately 45 degrees with respect to the uppermost surface of the substrate.

6. The method of claim 1, wherein the grove is formed by etching the semiconductor substrate.

7. An apparatus comprising:
   a semiconductor substrate including at least one grooved having an inclined surface and a light reception surface perpendicular to the uppermost surface of the semiconductor substrate, and a device forming area adjacent the light reception surface of;
   a reflection film formed over the inclined surface;
   a plurality of photodiodes substantially perpendicular to the uppermost surface of the substrate in the device forming portion; and
   at least one MOS transistor formed over the surface of the device forming portion.

8. The apparatus of claim 7, wherein the reflection film comprises a metal film that reflects visible light.

9. The apparatus of claim 7, wherein the plurality of photodiodes comprise a blue photodiode, a green photodiode and a red photodiode.

10. The apparatus of claim 9, wherein the blue photodiode, the green photodiode and the red photodiode are sequentially formed adjacent the light reception surface.

11. The apparatus of claim 7, wherein the inclined surface of the inclined groove portion has an angle of substantially 45 degrees with respect to the uppermost surface of the substrate.

12. A method comprising:
    providing a semiconductor substrate;
    forming at least one groove area in semiconductor substrate, the groove having a light reflecting surface and a light reception surface perpendicular to the uppermost surface of the semiconductor substrate;
    forming a film over light reflecting surface;
    sequentially forming a plurality of photodiodes over the semiconductor substrate; and then
    forming at least one transistor over the semiconductor substrate.

13. The method of claim 12, wherein light reflecting surface is formed at an inclined angle relative to the uppermost surface of the semiconductor substrate.

14. The method of claim 13, wherein the inclined angle is approximately 45 degrees.

15. The method of claim 12, wherein the film comprises a metal film which reflects visible light.

16. The method of claim 12, wherein the plurality of photodiodes comprise a blue photodiode, a green photodiode and a red photodiode.

17. The method of claim 12, wherein the blue photodiode is formed at a position closest to the light reception surface and the red photodiode is formed at a position farthest from the light reception surface.

18. The method of claim 12, wherein the at least one transistor comprises at least one MOS transistor.

19. The method of claim 18, wherein the at least one MOS transistor comprises a gate electrode, a spacer and a gate insulating film.

* * * * *